(12) United States Patent
Yamamoto

(10) Patent No.: US 6,800,923 B1
(45) Date of Patent: Oct. 5, 2004

(54) MULTILAYER ANALOG INTERCONNECTING LINE LAYOUT FOR A MIXED-SIGNAL INTEGRATED CIRCUIT

(75) Inventor: Sukehiro Yamamoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/422,909

(22) Filed: Apr. 25, 2003

(51) Int. Cl.$^7$ .............................................. H01L 29/00
(52) U.S. Cl. ...................................... 257/532; 257/535
(58) Field of Search ................................ 257/532, 535, 257/296, 300, 306, 311

(56) References Cited

U.S. PATENT DOCUMENTS

| | | | | |
|---|---|---|---|---|
| 5,598,029 A | * | 1/1997 | Suzuki | ........................ 257/665 |
| 5,917,230 A | * | 6/1999 | Aldrich | ........................ 257/532 |
| 6,387,770 B2 | * | 5/2002 | Roy | ............................. 438/384 |
| 2001/0023976 A1 | * | 9/2001 | Kawata et al. | ............... 257/532 |
| 2002/0192919 A1 | * | 12/2002 | Bothra | ......................... 438/381 |

* cited by examiner

Primary Examiner—Ngân V. Ngô
(74) Attorney, Agent, or Firm—Volentine Francos, PLLC

(57) ABSTRACT

A mixed-signal integrated circuit includes a metal-insulator-metal or polysilicon-insulator-polysilicon capacitor. The electrical path from one electrode of the capacitor passes through a first interconnecting line, then through multiple via holes to a second interconnecting line. During the fabrication process, the capacitor is first charged during a plasma deposition process used to deposit an interlayer dielectric film between the first and second interconnecting lines, then abruptly discharged during a plasma etching process that forms the via holes. The discharge does not damage the floors of the via holes, however, because each of the multiple via holes carries only part of the discharge current.

11 Claims, 5 Drawing Sheets

MULTILAYER ANALOG INTERCONNECTING LINE LAYOUT FOR A MIXED-SIGNAL INTEGRATED CIRCUIT

BACKGROUND OF THE INVENTION

1. Field of the Invention

The present invention relates to a mixed-signal integrated circuit, and more particularly to the interconnections in a mixed-signal integrated circuit.

2. Description of the Related Art

Mixed-signal integrated circuits, which incorporate both analog and digital circuitry, have become highly integrated, sometimes comprising an entire system on a chip (SoC). Their analog circuitry typically includes high-precision low-noise capacitors having a polysilicon-insulator-polysilicon (PIP) or metal-insulator-metal (MIM) structure with unit capacitance values in the general range from half a femtofarad to two femtofarads per square micrometer (0.5 fF/$\mu m^2$ to 2.0 fF/$\mu m^2$). These capacitors are interconnected to complementary metal-oxide-semiconductor (CMOS), bipolar CMOS (BiCMOS), and other types of circuits. At high levels of integration, multiple interconnection layers become necessary, the interconnections being routed on complex paths including both horizontal interconnecting lines and vertical contacts and vias.

Contacts connect circuit elements to horizontal interconnecting lines. A capacitor, for example, is typically connected to a horizontal interconnecting line by multiple contacts, to enable the capacitor to be charged and discharged rapidly.

Vias interconnect horizontal interconnecting lines in different layers. Normally two interconnecting lines are interconnected through a single via. This is particularly true in a highly integrated system-on-a-chip, in which layout space is at a premium.

The processes used to fabricate multilayer interconnections involve much use of ionized gases or plasmas. For example, the interlayer dielectric films that provide electrical insulation between different layers are often deposited by plasma-enhanced chemical vapor deposition (PE-CVD) or high-density plasma chemical vapor deposition (HDP-CVD). Contact holes and via holes are formed in the interlayer dielectric films by plasma etching processes. Plasma etching is also used to fashion horizontal interconnecting lines from metal films.

Since these plasma processes are carried out after the MIM or PIP capacitors have already been formed, some of the electrical charge of the plasma is transferred to the capacitors. Since the capacitors are almost always electrically floating, the charge cannot easily escape to the substrate or otherwise be removed.

As a result, when a contact hole or via hole leading directly or indirectly to a capacitor is formed by plasma etching, considerable charge may already have accumulated in the capacitor. At the instant when the hole is completely opened, or slightly thereafter, the capacitor abruptly discharges its accumulated charge through the hole into the plasma. When the via hole closest to the capacitor on the interconnection path is formed, the entire discharge is typically routed through a single via hole.

The sudden concentrated flow of discharge current through a single via hole can damage the floor of the via hole. If, for example, the floor of the via hole comprises a titanium nitride film formed on the surface of the underlying metal interconnecting line, this film may be oxidized and denitrified by the discharge, as observed in electron microscope studies by the inventor. If such damage occurs, then when the via hole is later filled with metal to form an interconnecting via, the via fails to make good electrical contact with the underlying metal interconnecting line, creating an abnormally high electrical resistance on the signal path. The analog circuit including the capacitor then acquires incorrect operating characteristics, or fails to operate at all. Investigations by the inventor have shown that this problem occurs when the total capacitance of the capacitor is 1700 fF or greater.

Further information will be given in the detailed description of the invention.

SUMMARY OF THE INVENTION

A general object of the present invention is to form a mixed-signal integrated circuit with correctly operating capacitive circuit elements.

A more specific object of the present invention is to prevent damage to via holes during the fabrication of a mixed-signal integrated circuit.

The invented mixed-signal integrated circuit includes a metal-insulator-metal or polysilicon-insulator-polysilicon capacitor and an interconnecting line coupled to the capacitor through at least two via holes formed in an interlayer dielectric film deposited by, for example, a high-density plasma deposition process.

The coupling may pass through another interconnecting line. For example, the invented mixed-signal integrated circuit may include a metal-insulator-metal or polysilicon-insulator-polysilicon capacitor, a first interconnecting line connected to the capacitor through one or more contact holes, a first interlayer dielectric film formed on the first interconnecting line, and a second interconnecting line connected to the first interconnecting line through at least two via holes formed in the first interlayer dielectric film. There may also be a second interlayer dielectric film formed on the first interlayer dielectric film and the second interconnecting line, and a third interconnecting line connected to the second interconnecting line through at least two via holes formed in the second interlayer dielectric film.

The invention additionally provides a method of fabricating a mixed-signal IC having a metal-insulator-metal or polysilicon-insulator-polysilicon capacitor covered and surrounded by a first interlayer dielectric film, the first interlayer dielectric film having at least one contact hole extending to the capacitor, the method comprising:

forming a first interconnecting line on the first interlayer dielectric film, the first interconnecting line being electrically connected to the capacitor through said at least one contact hole;

depositing a second interlayer dielectric film on the first interlayer dielectric film and the first interconnecting line by a plasma deposition process;

forming at least two first via holes in the second interlayer dielectric film by a plasma etching process, the first via holes extending to the first interconnecting line; and forming a second interconnecting line on the second interlayer dielectric film, the second interconnecting line being electrically connected to the first interconnecting line through the first via holes.

In this method, the plasma deposition process charges the capacitor, and the plasma etching process abruptly discharges the capacitor, but since the discharge current is divided among at least two via holes, the amount of discharge current flowing through each via hole is insufficient to damage the floor of the via hole.

Preferably, the capacitor has a total capacitance of at least 1700 femtofarads.

Preferably, the first via holes have respective diameters of at most 0.5 micrometer.

Preferably, among all via holes formed in the mixed-signal IC, the first via holes are electrically closest to the capacitor.

The method may further comprise:

depositing a third interlayer dielectric film on the second interlayer dielectric film and the second interconnecting line by a plasma deposition process;

forming at least two second via holes in the third interlayer dielectric film by a plasma etching process, the second via holes extending to the second interconnecting line; and forming a third interconnecting line on the third interlayer dielectric film, the third interconnecting line being electrically connected to the second interconnecting line through the second via holes.

The mixed-signal IC may be a system-on-a-chip.

The invention furthermore provides a method of laying out interconnections for a system-on-a-chip IC including a metal-insulator-metal or polysilicon-insulator-polysilicon capacitor, the method comprising:

routing a first interconnecting line in a first interconnection layer to a point above said capacitor, the capacitor being separated from the first interconnection layer by a first interlayer dielectric film;

providing at least one contact hole in the first interlayer dielectric film for electrical connection of the first interconnecting line to the capacitor;

routing a second interconnecting line in a second interconnection layer to a point above the first interconnecting line in the first interconnection layer, the first interconnection layer being separated from the second interconnection layer by a second interlayer dielectric film; and providing at least two first via holes in the second interlayer dielectric film for electrical connection of the second interconnecting line to the first interconnecting line.

Preferably, the capacitor has a total capacitance of at least 1700 femtofarads.

Preferably, the first via holes have respective diameters of at most 0.5 micrometer.

Preferably, among all via holes formed in the system-on-a-chip IC, the first via holes are electrically closest to the capacitor.

The method may further comprise:

routing a third interconnecting line in a third interconnection layer to a point above the second interconnecting line in the second interconnection layer, the second interconnection layer being separated from the third interconnection layer by a third interlayer dielectric film; and providing at least two second via holes in the third interlayer dielectric film for electrical connection of the third interconnecting line to the second interconnecting line.

Figure 1:
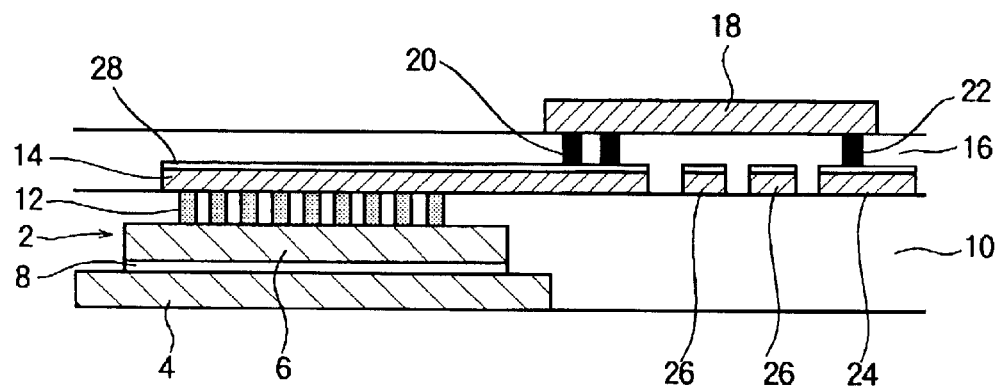
FIG. 1 is a sectional view of part of a mixed-signal integrated circuit embodying the present invention.
Figure 8:
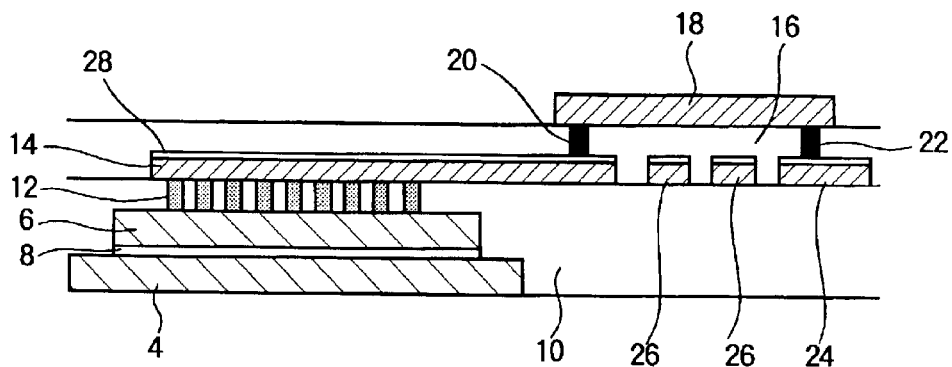
Figure 9:
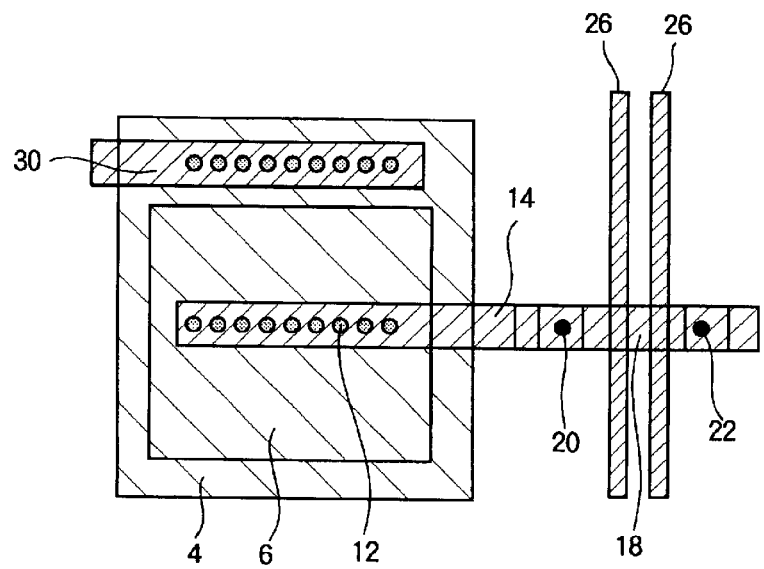
Figure 10:
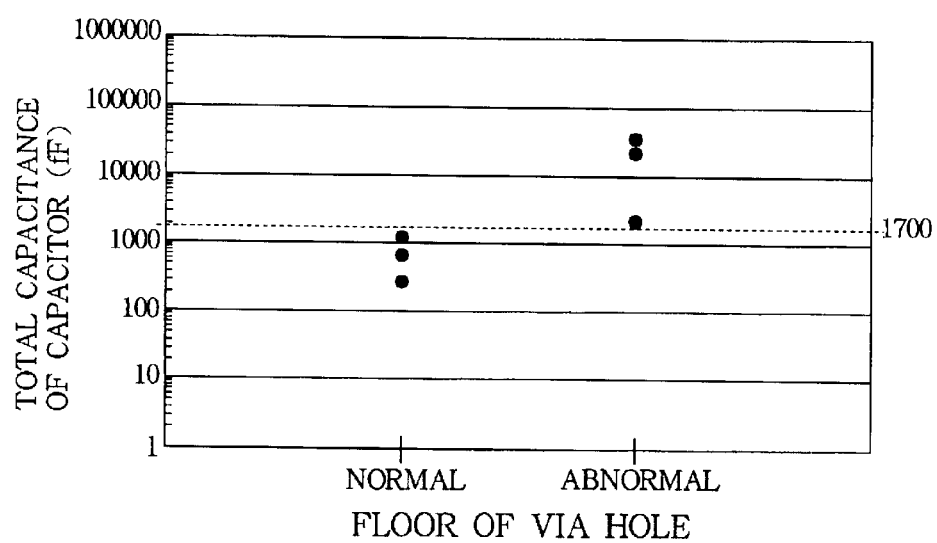
Figure 11:
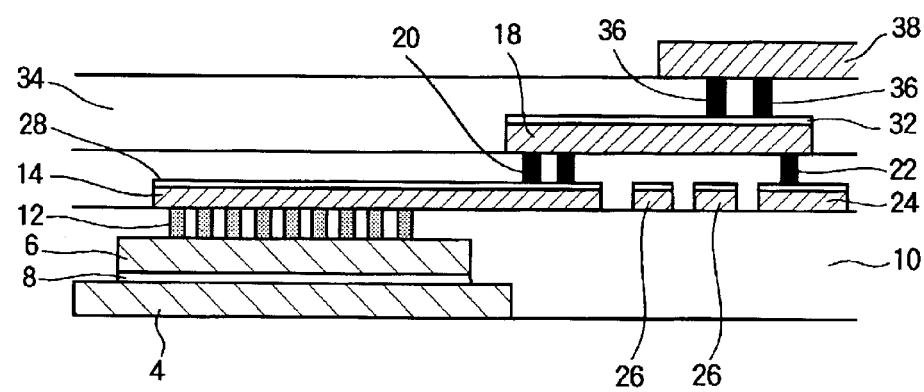

FIG, 2 is a plan view of the part shown in FIG. 1;

FIGS. 3, 4, 5, 6, and 7 are sectional views illustrating steps in a fabrication process for the mixed-signal integrated circuit shown in FIG. 1;

FIG. 8 is a sectional view of part of a conventional mixed-signal integrated circuit;

FIG. 9 is a plan view of the part shown in FIG. 8;

FIG. 10 is a graph showing total capacitance values at which via-hole floor abnormalities are and are not observed in a conventional mixed-signal integrated circuit of the type illustrated in FIG. 8; and FIG. 11 is a sectional view of part of another mixed-signal integrated circuit embodying the present invention.

DETAILED DESCRIPTION OF THE INVENTION

Mixed-signal integrated circuits (ICs) embodying the invention will now be described with reference to the attached drawings, in which like elements are indicated by like reference characters.

Referring to FIG. 1, in a first embodiment, a mixed-signal IC includes a capacitor 2 having a lower electrode 4 and an upper electrode 6 separated by a capacitor dielectric film 8. The capacitor 2 may be an MIM capacitor, in which case the upper and lower electrodes 6, 4 are patterned metal films, or a PIP capacitor, in which case the upper and lower electrodes 6, 4 are patterned polysilicon films. The capacitor 2 is covered and surrounded by a first interlayer dielectric film 10.

The upper electrode 6 is electrically coupled through contact holes 12 filled with tungsten contacts to a first interconnecting line 14 in a first interconnection layer formed on the surface of the first interlayer dielectric film 10. This first interconnection layer is covered by a second interlayer dielectric film 16, on the surface of which a second interconnecting line 18 is formed as part of a second interconnection layer. The first interconnecting line 14 is coupled to the second interconnecting line 18 through a pair of via holes 20 formed in the second interlayer dielectric film 16. The second interconnecting line 18 is interconnected through a third via hole 22 in the second interlayer dielectric film 16 to another interconnecting line 24 in the first interconnection layer. The purpose of routing the interconnection through the second interconnecting line, 18 is to pass over two further interconnecting lines 26 in the first interconnection layer. A liner 28 is formed on the surface of the interconnecting lines 14, 24, 26 in the first interconnection layer.

The interconnecting lines 14, 18, 24, 26 may be formed of aluminum, and the liner 28 of titanium nitride, although the invention is not limited to these materials.

Figure 2:
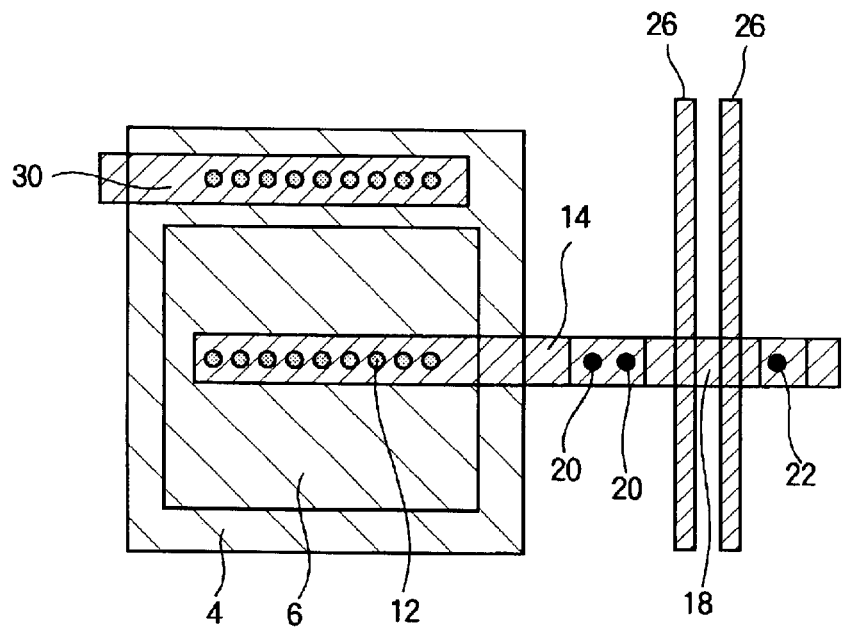

FIG. 2 shows a plan view of this part of the circuit, also showing an interconnecting line 30 that was not visible in FIG. 1, which is connected to the lower electrode 4 of the capacitor 2.

All MIM or PIP capacitors in the mixed-signal IC having total capacitance values of 1700 fF or more are formed as illustrated in FIGS. 1 and 2, with two via holes 20 at the first point, as seen from the capacitor, at which the electrical path from the upper electrode 6 is routed between two different interconnection layers.

Next, a fabrication process for the invented mixed-signal IC will be described. Only the steps that form the capacitor and interconnections shown in FIG. 1 will be described.

Figure 3:
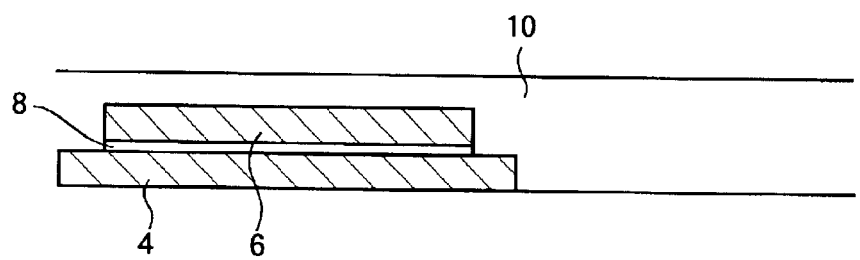

Referring to FIG. 3, the lower electrode 4, capacitor dielectric film 8, and upper electrode 6 of the capacitor 2 are formed by well-known deposition and patterning processes. The first interlayer dielectric film 10 is then deposited by plasma-enhanced chemical vapor deposition (PE-CVD), a process that charges the capacitor 2.

Figure 4:
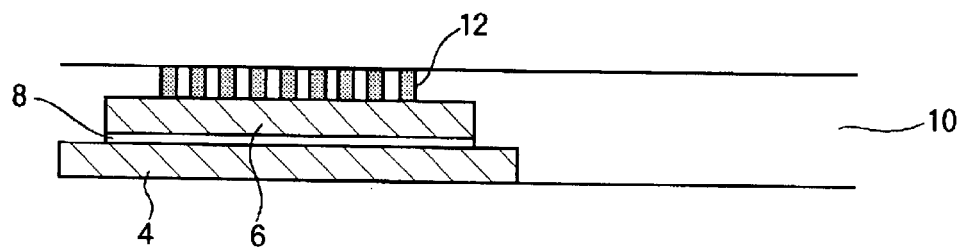

Referring to FIG. 4, the first interlayer dielectric film 10 is patterned by photolithography followed by a plasma etching process to form the contact holes 12 leading to the upper electrode 6 of the capacitor 2. This process is thought first to discharge, then to recharge the capacitor 2. The discharge does not damage the floors of the contact holes 12 because the discharge current is distributed over a plurality of contact holes. The desirable number of contact holes 12 depends on the size of the capacitor 2; as many contact holes 12 as needed to obtain satisfactorily rapid operation (charging and discharging) of the capacitor 2 should be provided.

The contact holes 12 are then filled with tungsten to form metal contacts. It is thought that the charge stored in the capacitor 2 so far is retained during this process.

The invention is not limited to the use of tungsten to fill the contact holes. Other conductive materials may be used instead.

Figure 5:
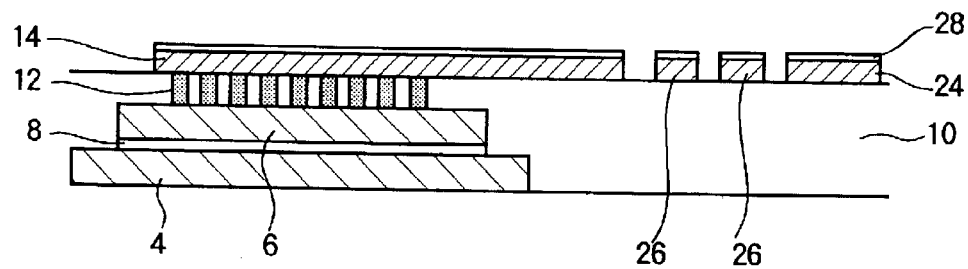

Referring to FIG. 5, the first interconnection layer, including interconnecting lines 14, 24, 26 and their liners 28, is formed by well-known deposition, photolithography, and etching processes in which a thin aluminum film, for example, is deposited on the first interlayer dielectric film 10, a very thin titanium nitride film is deposited on the aluminum film, and the two films are etched to create the interconnection pattern. The etching process is a plasma etching process that adds further charge to the capacitor 2, the charge being conducted to the upper electrode 6 through the tungsten contacts in the contact holes 12.

Figure 6:
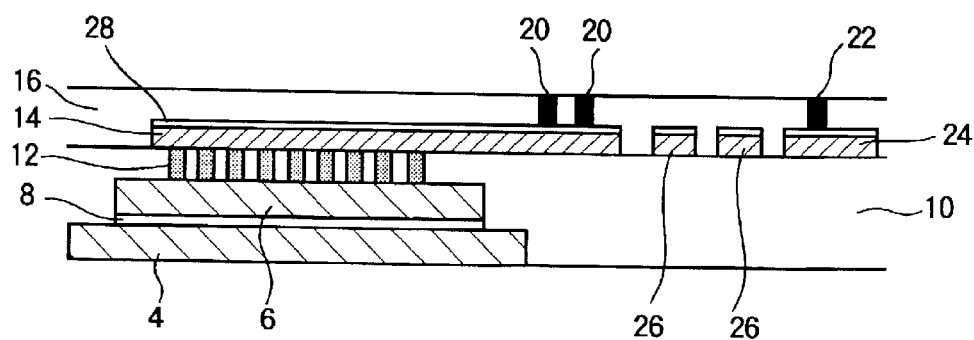

Referring to FIG. 6, the second interlayer dielectric film 16 is deposited to cover the first interconnection layer. This deposition process is carried out by a plasma deposition process such as PE-CVD or high-density plasma chemical vapor deposition (HDP-CVD). If the HDP-CVD process is used, the second interlayer dielectric film 16 may be referred to as an HDP dielectric film. Further charge is conducted to the capacitor 2 from the plasma through the first interconnecting line 14 and the tungsten plugs in the contact holes 12.

Next, the second interlayer dielectric film 16 is patterned by plasma etching to form via holes 20, 22. When the etching process reaches the liner 28 that forms the surface of the first interconnecting line 14, the charge that has accumulated in the capacitor 2 in the preceding steps discharges through the two via holes 20 into the plasma. Since the discharge is divided among two via holes, each via hole 20 receives only half of the discharge current. The via holes 20, 22 are then filled with tungsten.

Figure 7:
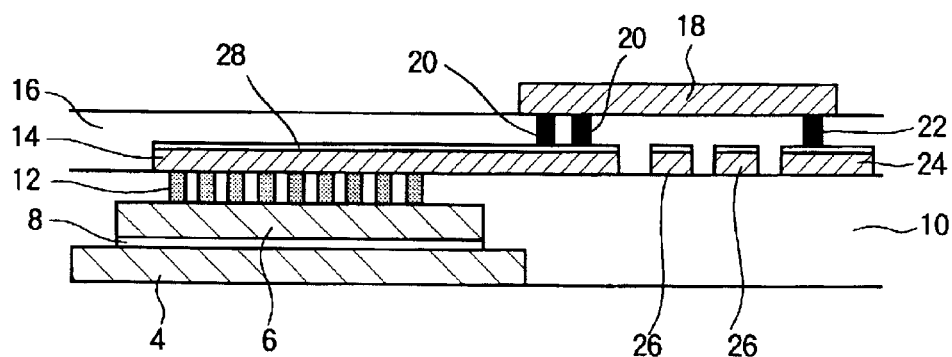

Referring to FIG. 7, the second interconnection layer, including the second interconnecting line 18, is formed by conventional film deposition, photolithography, and plasma etching processes. During the plasma etching process, the capacitor 2 is charged again, but the flow of charging current is divided between the two via holes 20.

By avoiding having the capacitor 2 charge or discharge through a single via hole during the fabrication process, the present invention avoids damage to the liner 28, and enables a good electrical connection to be formed and maintained between the tungsten metal in the via holes 20 and the metal of the first interconnecting line 14.

For comparison, FIGS. 8 and 9 show a conventional mixed-signal IC having only one via hole 20 at the first point, as seen from the capacitor, at which the electrical path from the upper electrode 6 of the capacitor 2 is routed from the first interconnection layer to the second interconnection layer. From the standpoint of integration density, one via hole is better than two, and since one via provides adequate conductivity between metal interconnecting lines, provision of just one via hole is the normal practice, especially in highly integrated system-on-a-chip ICs.

Aside from having only one via hole 20 between interconnecting lines 14 and 18, this mixed-signal IC is identical to the one in FIGS. 1 and 2, and it is fabricated by the process illustrated in FIGS. 3 to 7. When the second interlayer dielectric film 16 is patterned to form the via holes 20, 22, all of the charge that has accumulated in the capacitor 2 in the preceding fabrication steps discharges through the single via hole 20. The level of discharge current flow through the single via hole 20 can become high enough to produce significant damage, in the form of anode oxidation, to the liner 28. If this happens, then when the via hole 20 is filled with tungsten, an inadequate electrical coupling is formed between the tungsten and the first interconnecting line 14. As a result, in the completed IC, the capacitor 2 charges and discharges more slowly than intended, and the circuit fails to operate as designed.

FIG. 10 shows data obtained by the inventor for six capacitors in conventional mixed-signal ICs of the type illustrated in FIGS. 8 and 9, each having a single via hole 20 at the first point at which the electrical path from the upper electrode of the capacitor is routed from the first interconnection layer to the second interconnection layer. The total capacitance of the capacitor 2 is indicated on the vertical axis, total capacitance being the product of the unit capacitance and the surface area of the capacitor. The occurrence or non-occurrence of abnormalities in the liner 28 at the bottom of the via hole 20 is indicated on the horizontal axis. Abnormalities were observed in the three cases in which the total capacitance exceeded 1700 fF, and were not observed in the three cases in which the total capacitance was less than 1700 fF. It can be concluded that multiple via holes are particularly advisable when the total capacitance of the capacitor exceeds 1700 fF.

The occurrence of damage to the liner 28 is also related to the size of the via holes. The damage indicated in FIG. 10 occurred in via holes with diameters of half a micrometer (0.5 μm) or less.

Referring to FIG. 11, in a second embodiment of the invention, the mixed-signal IC has three interconnection layers. The IC in FIG. 11 includes all of the elements shown in the first embodiment. In addition, a liner 32 of titanium nitride, for example, is formed on the second interconnecting line 18. A third interlayer dielectric film 34 is deposited on the second interlayer dielectric film 16 and second interconnecting line 18 by a plasma deposition process such as PE-CVD or HDP-CVD. A pair of via holes 36 are formed in the third interlayer dielectric film 34 by plasma etching, and are filled with tungsten. A third interconnecting line 38 is formed on the third interlayer dielectric film 34, and is electrically coupled to the second interconnecting line 18 through the pair of tungsten plugs in the via holes 36.

The fabrication process for the second embodiment is similar to the fabrication process for the first embodiment, the steps that form the liner 32, the third interlayer dielectric film 34, the via holes 36, and the third interconnecting line 38 being essentially a repetition of the steps that formed the liner 28, the second interlayer dielectric film 16, the via holes 20, 22, and the second interconnecting line 18 in the first embodiment. The capacitor 2 is charged during the deposition of the third interlayer dielectric film 34, and discharged when the via holes 36 are formed, but since the discharge current is divided between two via holes 20, damage to liner 28 is avoided, and since the discharge current is also divided between two via holes 36, damage to the liner 32 is avoided.

The number of via holes 20 provided between the first and second interconnecting lines 14, 18 is not limited to the two holes shown in FIGS. 1, 2, and 11. If necessary, three or more via holes can be provided to reduce the flow of charge and discharge current through each via hole still further, thereby providing a higher level of protection from damage to the liner 28 during the fabrication process. Similarly, three or more via holes 36 may be provided between the second interconnecting line 18 and the third interconnecting line 38 in FIG. 11.

If the IC has more than three layers of interconnections, multiple via holes may also be provided for the higher layers in a similar way, to avoid having the capacitor 2 discharge through a single via hole at any point during the fabrication process.

In general, in each interlayer dielectric film, multiple via holes are necessary only at the first point at which the electrical path from the capacitor 2 is routed through that interlayer dielectric film from an interconnecting line in a lower layer to an interconnecting line in a higher layer, since this is the point through which the capacitor 2 discharges during the fabrication process. For example, a single via hole 22 suffices in FIGS. 1 and 11 because when the via holes 20, 22 in the second interlayer dielectric film 16 are formed, the capacitor 2 is not yet coupled to via hole 22, and when the capacitor 2 discharges during the formation of via holes 36 in FIG. 11, the discharge takes place through via holes 20, second interconnecting line 18, and via holes 36, not through via hole 22. With certain interconnection topologies, however, the capacitor 2 can discharge through a via hole similar to via hole 22 during the fabrication process, in which case multiple via holes would be advisable at this point. In any case, multiple via holes are always advisable at the via that is electrically closest to the capacitor 2.

Those skilled in the art will recognize that further variations are possible within the scope of the invention, which is defined in the appended claims.

What is claimed is:

1. A semiconductor device having a mixed-signal integrated circuit, comprising:
   a metal-insulator-metal or polysilicon-insulator-polysilicon capacitor;
   a first interlayer dielectric film formed over the capacitor;
   a first interconnecting line formed on the first interlayer dielectric film, the first interconnecting line being coupled to the capacitor through a plurality of first via holes formed in the first interlayer dielectric film;
   a second interlayer dielectric film formed over the first interconnecting line; and
   a second interconnecting line formed on the second interlayer dielectric film, the second interconnecting line being coupled with the first interconnecting line through a plurality of second via holes formed in the second interlayer dielectric film.

2. The semiconductor device of claim 1, wherein the capacitor has a total capacitance of at least 1700 femtofarads.

3. The semiconductor device of claim 1, wherein the plurality of first via holes have respective diameters of at most 0.5 micrometer.

4. The semiconductor device of claim 1, wherein among all via holes in the semiconductor device, at least two of the plurality of first via holes are electrically closest to the capacitor.

5. The semiconductor device of claim 1, wherein the mixed-signal integrated circuit is a system-on-a-chip.

6. A semiconductor device having a mixed-signal integrated circuit, comprising:
   a metal-insulator-metal or polysilicon-insulator-polysilicon capacitor;
   a first interconnecting line connected to the capacitor through at least one contact hole;
   a first interlayer dielectric film formed on the first interconnecting line; and
   a second interconnecting line formed on the first interlayer dielectric film, the second interconnecting line directly coupled to the first interconnecting line through at least two via holes formed in the first interlayer dielectric film.

7. The semiconductor device of claim 6, wherein the capacitor has a total capacitance of at least 1700 femtofarads.

8. The semiconductor device of claim 6, wherein said at least two via holes have respective diameters of at most 0.5 micrometer.

9. The semiconductor device of claim 6, wherein among all via holes in the mixed-signal IC, said at least two via holes are electrically closest to the capacitor.

10. The semiconductor device of claim 6, further comprising:
    a second interlayer dielectric film disposed on the first interlayer dielectric film and the second interconnecting line; and
    a third interconnecting line formed on the second interlayer dielectric film, electrically coupled to the second interconnecting line through at least two via holes formed in the second interlayer dielectric film.

11. The semiconductor device of claim 6, wherein the mixed-signal integrated system is a system-on-a-chip.

* * * * *